United States Patent
Ikari

(10) Patent No.: US 9,891,452 B2
(45) Date of Patent: Feb. 13, 2018

(54) MAGNETO-OPTICAL MATERIAL, METHOD FOR PRODUCING SAME AND MAGNETO-OPTICAL DEVICE

(71) Applicant: SHIN-ETSU CHEMICAL CO., LTD., Tokyo (JP)

(72) Inventor: Masanori Ikari, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 54 days.

(21) Appl. No.: 14/904,504

(22) PCT Filed: Jun. 5, 2014

(86) PCT No.: PCT/JP2014/064953
§ 371 (c)(1),
(2) Date: Jan. 12, 2016

(87) PCT Pub. No.: WO2015/008553
PCT Pub. Date: Jan. 22, 2015

(65) Prior Publication Data
US 2016/0209683 A1    Jul. 21, 2016

(30) Foreign Application Priority Data
Jul. 19, 2013  (JP) ................. 2013-150316

(51) Int. Cl.
| | |
|---|---|
| *G02F 1/09* | (2006.01) |
| *C01F 17/00* | (2006.01) |
| *C30B 29/46* | (2006.01) |
| *C04B 35/547* | (2006.01) |
| *C04B 35/645* | (2006.01) |

(52) U.S. Cl.
CPC .......... *G02F 1/093* (2013.01); *C01F 17/0093* (2013.01); *C04B 35/547* (2013.01);
(Continued)

(58) Field of Classification Search
CPC ........ G02F 1/09; G02F 1/093; C01F 17/0093; C04B 35/547; C04B 35/6455;
(Continued)

(56) References Cited

U.S. PATENT DOCUMENTS

| | | |
|---|---|---|
| 5,217,647 A | 6/1993 | Tono et al. |
| 6,208,795 B1 | 3/2001 | Nakano et al. |

(Continued)

FOREIGN PATENT DOCUMENTS

| | | |
|---|---|---|
| EP | 2 500 763 A1 | 9/2012 |
| JP | 3-252495 A | 11/1991 |

(Continued)

OTHER PUBLICATIONS

International Search Report dated Sep. 9, 2014, issued in counterpart International Application No. PCT/JP2014/064953 (2 pages).

(Continued)

*Primary Examiner* — Marin Pichler
(74) *Attorney, Agent, or Firm* — Westerman, Hattori, Daniels & Adrian, LLP

(57) ABSTRACT

Provided is a magneto-optical material which does not absorb fiber laser light in a wavelength range of 0.9-1.1 μm and does not cause a thermal lens, while having a larger Verdet constant than TGG crystals, and which is suitable for constituting a magneto-optical device such as an optical isolator. This magneto-optical material is formed of a single crystal of a rare earth oxysulfide that is represented by formula (1) or a transparent ceramic which contains, as a main component, a rare earth oxysulfide that is represented by formula (1), and this magneto-optical material has a Verdet constant of 0.14 min/(Oe·cm) or more at the wavelength of 1,064 nm.

$$(Tb_xR_{1-x})_2O_2S \qquad (1)$$

(In the formula, x is 0.3 or more but less than 1; and R represents at least one rare earth element that is selected from the group consisting of yttrium, lutetium, gadolinium, holmium, scandium, ytterbium, europium and dysprosium.)

9 Claims, 1 Drawing Sheet

(52) U.S. Cl.
CPC .......... *C04B 35/6455* (2013.01); *C30B 29/46*
(2013.01); *C01P 2006/42* (2013.01); *C01P 2006/60* (2013.01); *C04B 2235/3224* (2013.01); *C04B 2235/3225* (2013.01); *C04B 2235/3244* (2013.01); *C04B 2235/608* (2013.01); *C04B 2235/6567* (2013.01); *C04B 2235/661* (2013.01); *C04B 2235/77* (2013.01); *C04B 2235/9646* (2013.01)

(58) Field of Classification Search
CPC .... C04B 2235/3224; C04B 2235/3225; C04B 2235/3227; C04B 2235/3244; C04B 2235/66; C04B 2235/661; C04B 2235/9646; C04B 2235/9653; C04B 3/547; C04B 3/6455; C01P 2006/42; C01P 2006/60; C30B 29/46
USPC .......................... 359/484.02, 484.03, 484.04
See application file for complete search history.

(56) References Cited

U.S. PATENT DOCUMENTS

| | | |
|---|---|---|
| 8,753,538 B2 | 6/2014 | Makikawa et al. |
| 2007/0275620 A1* | 11/2007 | Den Toonder ...... H01L 51/5203 442/181 |
| 2011/0133111 A1* | 6/2011 | Makikawa ............. C04B 35/50 252/62.51 R |
| 2012/0236409 A1* | 9/2012 | Yahagi ................... G02F 1/093 359/484.03 |
| 2013/0222909 A1 | 8/2013 | Makikawa et al. |
| 2014/0001424 A1 | 1/2014 | Shimada |

FOREIGN PATENT DOCUMENTS

| | | |
|---|---|---|
| JP | 2000-266947 | 9/2000 |
| JP | 2002-293693 A | 10/2002 |
| JP | 2004-123884 A | 4/2004 |
| JP | 2010-285299 A | 12/2010 |
| JP | 2011-121837 A | 6/2011 |
| JP | 2011-213552 A | 10/2011 |
| WO | 2012/046755 A1 | 4/2012 |
| WO | 2012/124753 A1 | 9/2012 |

OTHER PUBLICATIONS

Extended (supplementary) European Search Report dated Dec. 15, 2016, issued in counterpart European Application No. 14826337.9. (6 pages).

* cited by examiner

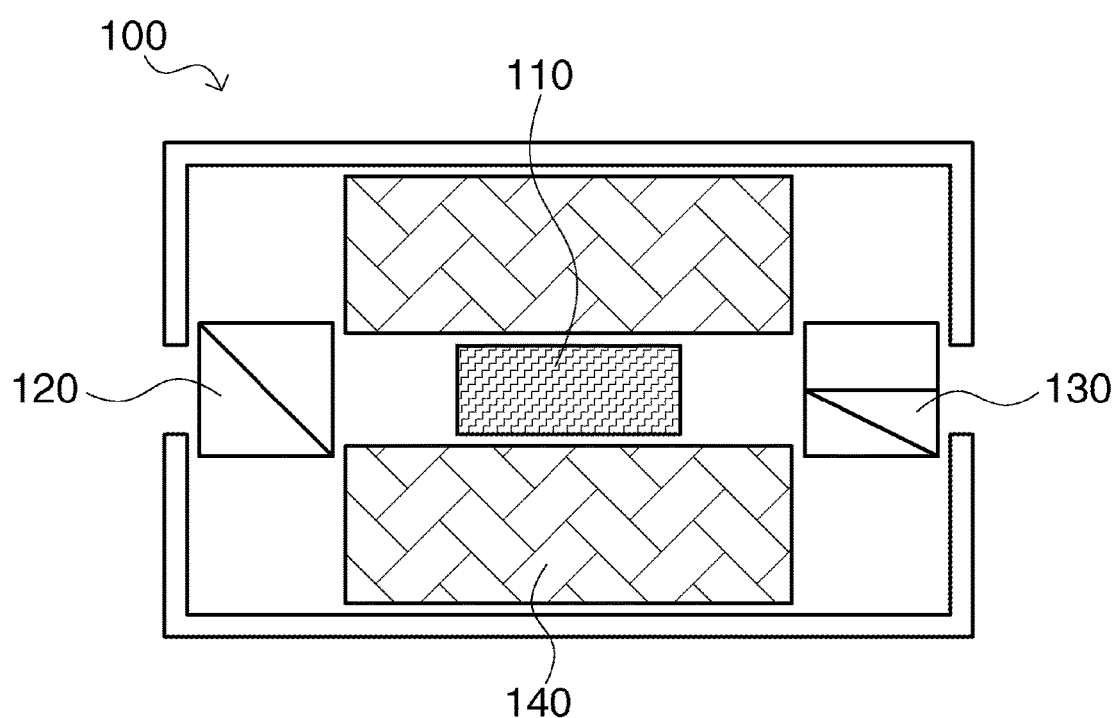

US 9,891,452 B2

MAGNETO-OPTICAL MATERIAL, METHOD FOR PRODUCING SAME AND MAGNETO-OPTICAL DEVICE

TECHNICAL FIELD

This invention relates to a magneto-optical material, a method for producing such a material, and a magneto-optical device. More specifically, the invention relates to a magneto-optical material that is made of a rare-earth oxy-sulfide-containing transparent ceramic or single crystal and is suitable for constructing a magneto-optical device such as an optical isolator, a method for producing such a magneto-optical material, and a magneto-optical device that uses such a magneto-optical material.

BACKGROUND ART

In recent years, partly on account of the higher power levels that have become possible, there has been a remarkable growth in the use of laser beam machines which employ fiber lasers. However, the resonance state of the laser light source built into a laser beam machine is destabilized by the entry of outside light, disturbing the oscillation state. Disruption of the oscillation state is particularly severe when the light that has been generated is reflected by intermediate optics and returns to the light source. To keep this from happening, an optical isolator is generally provided just in front of the light source, for example.

Optical isolators are made of a Faraday rotator, a polarizer situated on the input side of the Faraday rotator, and an analyzer situated on the output side of the Faraday rotator. The Faraday rotator is used by applying a magnetic field parallel to the propagation direction of light, at which time a polarized component of light, whether traveling forward or backward through the Faraday rotator, rotates only in a fixed direction. In addition, the Faraday rotator is adjusted to a length such that the polarized component of light rotates exactly 45°. When the polarizer and analyzer planes of polarization are offset by 45° in the direction of rotation by forward-traveling light, polarized light traveling forward coincides with the polarizer position and with the analyzer position and thus passes through each. By contrast, polarized light traveling backward from the analyzer position rotates 45° in the opposite direction from the direction of angle offset by the polarizer plane of polarization that is offset 45°. As a result, the returning light has a plane of polarization at the polarizer position that is offset 45°−(−45°)=90° with respect to the polarizer plane of polarization, and thus cannot pass through the polarizer. Hence, the optical isolator functions by allowing forward-traveling light to pass through and exit therefrom and by blocking backward-traveling return light.

Materials hitherto know to be capable of use as the Faraday rotator in optical isolators include TGG crystals ($Tb_3Ga_5O_{12}$) and TSAG crystals ($Tb_{(3-x)}Sc_2Al_3O_{12}$) (see JP-A 2011-213552 and JP-A 2002-293693 (Patent Documents 1 and 2, respectively)). TGG crystals have a relatively large Verdet constant of 40 rad/(T·m), and today are widely used in standard fiber laser systems. TSAG crystals have a Verdet constant which is reportedly about 1.3 times that of TGG crystals and is likewise a material used in fiber laser systems.

In addition, JP-A 2010-285299 (Patent Document 3) discloses a single crystal or ceramic composed primarily of the oxide $(Tb_xR_{1-x})_2O_2$, wherein $0.4 \leq x \leq 1.0$ and R is selected from the group consisting of scandium, yttrium, lanthanum, europium, gadolinium, ytterbium, holmium and lutetium. Oxides composed of these constituents have Verdet constants of 0.18 min/(Oe·cm) or more, with the largest Verdet constant mentioned in the examples provided therein being 0.33 min/(Oe·cm). The same document also mentions, in the text thereof, a Verdet constant for TGG of 0.13 min/(Oe·cm). Hence, the difference between the Verdet constants for both is 2.5-fold.

An oxide composed of substantially similar components is disclosed in JP-A 2011-121837 (Patent Document 4) as well, where it is mentioned that this oxide has a larger Verdet constant than a TGG single crystal.

When, as in Patent Documents 3 and 4 above, an optical isolator having a large Verdet constant is obtained, the total length required for 45° rotation can be shortened, which is desirable in that it makes a smaller optical isolator possible.

One material that has a very large Verdet constant per unit length is iron (Fe)-containing yttrium iron garnet (YIG) single crystals (JP-A 2000-255947 (Patent Document 5)). However, iron has a large light absorption at a wavelength of 0.9 μm, which absorption affects optical isolators used in the wavelength range of 0.9 to 1.1 μm. This makes optical isolators that use such yttrium iron garnet single crystals difficult to employ in fiber laser systems where the trend is clearly toward higher power levels.

PRIOR ART DOCUMENTS

Patent Documents

Patent Document 1: JP-A 2011-213552
Patent Document 2: JP-A 2002-293693
Patent Document 3: JP-A 2010-285299
Patent Document 4: JP-A 2011-121837
Patent Document 5: JP-A 2000-266947

SUMMARY OF THE INVENTION

Problems to be Solved by the Invention

Although the $(Tb_2R_{1-x})_2O_3$ oxides disclosed in Patent Documents 3 and 4 do indeed have very large Verdet constants which are 1.4 to 2.5 times as large as those of the TGG crystals disclosed in Patent Document 1 and the TGG crystals mentioned in the text of Patent Document 3, they end up slightly absorbing fiber laser light in the wavelength range of 0.9 to 1.1 μm where they are expected to be used. With fiber lasers in recent years becoming increasingly high-powered, a large absorption such as that by yttrium iron garnet is out of the question. Yet, even when a laser is equipped with an optical isolator having only slight absorption, this leads to deterioration in beam quality on account of a thermal lens effect.

This invention was arrived at in view of the above circumstances. The object of the invention is to provide a magneto-optical material which does not absorb fiber laser light in the wavelength range of 0.9 to 1.1 μm and thus does not generate a thermal lens, which has a larger Verdet constant than TGG crystals, and which is suitable for constructing a magneto-optical device such as an optical isolator. Further objects of the invention are to provide a method for producing such a magneto-optical material, and to provide a magneto-optical device using such a material.

Means for Solving the Problems

In order to attain the above objects, the invention provides the following magneto-optical material, method of production thereof, and magneto-optical device.

[1] A magneto-optical material which is characterized by comprising either a transparent ceramic containing as a primary component a rare-earth oxysulfide of formula (1) below or a single-crystal of a rare-earth oxysulfide of formula (1)

$$(Tb_xR_{1-x})_2O_2S \quad (1)$$

(wherein x is 0.3 or more but less than 1, and R is at least one rare-earth element selected from the group consisting of yttrium, lutetium, gadolinium, holmium, scandium, ytterbium, europium and dysprosium), and having a Verdet constant at a wavelength of 1064 nm that is at least 0.14 min/(Oe·cm).

[2] The magneto-optical material of [1] which is characterized in that when laser light having a wavelength of 1064 nm is input thereto at a beam diameter of 1.6 mm, for an optical path length of 10 mm, the maximum input power of laser light which does not generate a thermal lens is 40 W or more.

[3] The magneto-optical material of [1] or [2] which, for an optical path length of 10 mm, has an in-line transmittance of light at a wavelength of 1064 nm that is at least 60%.

[4] A method for producing a magneto-optical material, comprising the steps of firing in a crucible terbium oxide powder, a rare-earth oxide powder of at least one rare-earth element selected from the group consisting of yttrium, lutetium, gadolinium, holmium, scandium, ytterbium, europium and dysprosium, and sulfur powder; grinding the fired powders to form a rare-earth oxysulfide material powder; pressing the rare-earth oxysulfide material powder into a predetermined shape; and then sintering and hot isostatic pressing the shaped powder to form a transparent ceramic sintered compact containing as a primary component a rare-earth oxysulfide of formula (1) below $$(Tb_xR_{1-x})_2O_2S \quad (1)$$

(wherein x is 0.3 or more but less than 1, and R is at least one rare-earth element selected from the group consisting of yttrium, lutetium, gadolinium, holmium, scandium, ytterbium, europium and dysprosium).

[5] A magneto-optical device which is constructed using the magneto-optical material of any one of [1] to [3].

[6] The magneto-optical device of [5] which is an optical isolator that comprises the magneto-optical material as a Faraday rotator and a polarizing material at front and back sides of the Faraday rotator on an optical axis thereof, and that can be used in a wavelength range of at least 0.9 μm and not more than 1.1 μm.

[7] The magneto-optical device of [6], wherein the Faraday rotator has an antireflective coating on an optical face thereof.

Advantageous Effects of the Invention

The invention, by using an oxysulfide in which some of the terbium is substituted with other rare-earth elements in a predetermined ratio, can provide a magneto-optical material which is suitable for constructing a magneto-optical device such as an optical isolator that, even when mounted in a fiber laser system having a wavelength range of 0.9 to 1.1 μm, does not degrade the beam quality, and which has a Verdet constant at least 1.4 times as large as that of a TGG crystal and thus lends itself to miniaturization.

BRIEF DESCRIPTION OF THE DIAGRAM

FIG. 1 is a schematic cross-sectional view showing an example of an optical isolator in which the magneto-optical material of the invention is used as a Faraday rotator.

EMBODIMENT FOR CARRYING OUT THE INVENTION

Magneto-Optical Material

The magneto-optical material of the invention is described below.

The magneto-optical material of the invention is characterized by being composed of either a transparent ceramic containing as a primary component a rare-earth oxysulfide of formula (1) below or a single-crystal of a rare-earth oxysulfide of formula (1)

$$(Tb_xR_{1-x})_2O_2S \quad (1)$$

(wherein x is 0.3 or more but less than 1, and R is at least one rare-earth element selected from the group consisting of yttrium (Y), lutetium (Lu), gadolinium (Gd), holmium (Ho), scandium (Sc), ytterbium (Yb), europium (Eu) and dysprosium (Dy)), and by having a Verdet constant at a wavelength of 1064 nm that is at least 0.14 min/(Oe·cm).

Terbium has, with the exception of iron (Fe), the largest Verdet constant of the paramagnetic elements, and moreover is transparent at a wavelength of 1.06 μm (in-line transmittance of light for an optical path length of 1 mm, ≥80%). It is therefore the element best suited for use in optical isolators in this wavelength region. However, to take full advantage of such transparency, terbium cannot be in a metallically bonded state and must be rendered into the state of a stable compound.

Examples of ordinary elements that form stable compounds with terbium include those that form chalcogenides. Of such chalcogenide-forming elements, two are transparent at a wavelength of 1.06 μm: oxygen and sulfur. That is, oxides or sulfides that are terbium-containing systems are preferred for use in optical isolators at a wavelength of 1.06 μm.

Yet, whether the terbium is part of an oxide system or part of a sulfide system, phase change effects arise in this state, making it difficult to pull a single crystal or to fabricate a transparent ceramic. Hence, it is preferable to produce a solid solution with an element which is a rare-earth element having the same crystal structure as terbium oxide or terbium sulfide and a similar ionic radius, which does not undergo phase changes at 1,000° C. and below, and which, moreover, has a high transparency at a wavelength of 1.06 μm.

As such elements, preferred use can be made of yttrium, lutetium, gadolinium, holmium, scandium, ytterbium, europium or dysprosium.

Because toxic gases such as $SO_x$ are released as by-products in the course of sulfide production, when a sulfide is selected, it is preferable to suppress the release of toxic gases by substituting, to the extent possible, some of the sulfur ions with oxygen.

It has been confirmed that, in this invention, the oxysulfide of formula (1), while limiting the degree of sulfur ion substitution, further reduces, compared with simply an oxide, the slight absorption that occurs in the wavelength range of 0.9 to 1.1 μm where the magneto-optical material is expected to be used, thus increasing the maximum power at which light input is possible without generating a thermal lens.

In formula (1), R includes at least one rare-earth element selected from the group consisting of yttrium, lutetium, gadolinium, holmium, scandium, ytterbium, europium and dysprosium, but is not particularly limited to these and may include also other elements. Examples of such other elements include thulium and cerium.

The content of such other elements, based on a value of 100 for the total amount of R, is preferably 10 or less, more preferably 0.1 or less, and most preferably 0.001 or less (substantially zero).

Here, R is not particularly limited and may be a single element, or may be a plurality of R elements included in any ratio. Of the above elements, from the standpoint of the availability of the raw materials, R is preferably yttrium, lutetium or gadolinium, and more preferably yttrium.

In formula (1), x is 0.3 or more but less than 1, preferably at least 0.3 and not more than 0.8, and more preferably at least 0.45 and not more than 0.75. When x is less than 0.3, a high Verdet constant cannot be obtained. A value for x in the above range is desirable because a high Verdet constant can be obtained, in addition to which the transparency is excellent. Also, having x be not more than 0.8 is preferable because crack formation owing to terbium phase change effects is suppressed.

The magneto-optical material of the invention includes as a primary component a rare-earth oxysulfide of formula (1). So long as it includes a rare-earth oxysulfide of formula (1) as the primary component, the magneto-optical material of the invention may include also other components as secondary components.

Here, "includes as a primary component" means to include the rare-earth oxysulfide of formula (1) in an amount of at least 50 wt %. The content of the rare-earth oxysulfide of formula (1) is preferably at least 80 wt %, more preferably at least 90 wt %, even more preferably at least 99 wt %, and most preferably at least 99.5 wt %.

Secondary components (components other than the primary component) are generally exemplified by dopants used for doping during the growth of a single crystal, fluxes, and sintering aids that are added during ceramic production. Specific examples include oxides of magnesium, titanium, silicon, calcium, aluminum, strontium, barium, zirconium and hafnium. Of these, secondary components which are preferred as sintering aids for addition during ceramic production typically include oxides or carbonates of titanium, silicon, calcium, aluminum, barium, zirconium and hafnium.

Methods for producing the magneto-optical material of the invention include single crystal production methods such as the float-zone method and micro-pulling-down, and ceramic production methods. Any of these production methods may be used. However, in single crystal production methods, there is generally a certain degree of limitation in design of the concentration ratio for the solid solution. Hence, a ceramic production method is more preferred in this invention.

A ceramic production method is described more fully below as an example of a method for producing the magneto-optical material of the invention, although single crystal production methods in accordance with the technical ideas of this invention are not excluded.

<<Ceramic Production Method>>
[Raw Materials]

Raw materials suitable for use in this invention include rare-earth metal powders that are composed of terbium and the rare-earth element R (R being at least one rare-earth element selected from the group consisting of yttrium, lutetium, gadolinium, holmium, scandium, ytterbium, europium and dysprosium) and furnish the constituent elements of the magneto-optical material of the invention, or nitric acid aqueous solutions, sulfuric acid aqueous solutions, uric acid aqueous solutions, etc. of these rare-earth elements. Alternatively, oxide powders, sulfide powders, etc. of these rare-earth elements may be suitably used as raw materials.

From the standpoint of cost, a preferred method involves purchasing oxide powders of the above constituent elements and a sulfur (S) powder, weighing these out in given amounts, then mixing and subsequently firing them to obtain a rare-earth oxysulfide of a predetermined composition. The purity of these raw materials is preferably at least 99.9 wt %.

Ultimately, ceramic production is carried out using a rare-earth oxysulfide powder of the desired composition. The shape of the powder at this time is not particularly limited. For example, suitable use may be made of an angular, spherical or lamellar powder. Alternatively, a powder of secondary agglomerated particles may be suitably used, or a granular powder obtained by granulating treatment such as spray drying may be suitably used. The processes used to prepare such starting powders are not particularly limited. Starting powders produced by co-precipitation, grinding, spray pyrolysis, the sol-gel method, alkoxide hydrolysis and various other methods of synthesis may be suitably used. The resulting powder may be suitably treated in, for example, a wet ball mill, bead mill or jet mill, or a dry jet mill or hammer mill.

A suitable sintering inhibitor may be added to the rare-earth oxysulfide starting powder used in the invention. The addition of a sintering inhibitor compatible with the terbium oxysulfide and other selected rare-earth oxysulfides is especially preferred for obtaining a high transparency. The purity thereof is preferably at least 99.9%. The sintering inhibitor is added in an amount, based on the total weight of the primary component (100 wt %), of preferably 5 wt % or less, more preferably 1 wt % or less, and even more preferably 0.5 wt % or less. In cases where a sintering inhibitor is not added, it is desirable to select, as the starting powder to be used, one in which the primary particles are nanosized and which has a very high sintering activity. Such selection may be made as appropriate.

Various types of organic additives are sometimes added for stable quality and improved yield in the production process. These are not particularly limited in the invention. Preferred use can be made of, for example, various types of dispersants, binders, lubricants and plasticizers.

[Production Process]

In this invention, the starting powder is pressed into a predetermined shape, after which debinding is carried out. The powder is then sintered, thereby producing a sintered body that has been densified to a relative density of not less than 92%. Hot isostatic pressing (HIP) is preferably carried out in a subsequent step.

(Pressing)

An ordinary pressing step may be suitably used in the production method of the invention. That is, a very common pressing step may be used, such as one in which the starting powder is filled into a mold and pressure is applied from a fixed direction, or a cold isostatic pressing (CIP) step in which the starting powder is placed and sealed within a deformable waterproof container and hydrostatic pressure is applied. The applied pressure may be suitably adjusted while checking the relative density of the compact obtained and is not particularly limited, although production costs can be held down by controlling the applied pressure within the range of up to about 300 MPa that commercial CIP equipment is capable of handling. Alternatively, a hot pressing step or spark plasma sintering step which, during forming, not only carries out a forming step but also proceeds without interruption to sintering, or a microwave heating step or the like may be suitably used.

(Debinding)

An ordinary debinding step may be suitably used in the production method of the invention. That is, production may proceed via a debinding step at an elevated temperature within a heating furnace. The type of atmospheric gas at this time is not particularly limited; for example, suitable use can be made of air, oxygen, hydrogen or the like. The debinding temperature also is not particularly limited, although when using raw materials having organic additives mixed therein, it is preferable to raise the temperature to a level at which the organic ingredients can decompose and be eliminated.

(Sintering)

An ordinary sintering step may be suitably used in the production method of the invention. That is, a heat sintering step that entails resistance heating, induction heating or the like may be suitably used. The atmosphere at this time is not particularly limited, although suitable use may be made of, for example, inert gas, oxygen, hydrogen or a vacuum.

The sintering temperature in the sintering step of the invention is suitably adjusted according to the raw materials selected for use. Generally, it is preferable to choose a temperature which is from several tens of degrees Celsius to about 100° C. or 200° C. lower than the melting point of the rare-earth oxysulfide sintered body to be produced using the raw materials that have been selected. When a rare-earth oxysulfide sintered body is to be produced for which there exists, near the chosen temperature, a temperature region at which a phase change to a phase other than a cubic system occurs, sintering under strict control to ensure that the temperature remains below this level has the advantage of discouraging the formation of optical strain, cracking and the like in the material because substantially no phase changes from a cubic to a non-cubic system occur.

The sintering dwell time in this sintering step of the invention is suitably adjusted according to the raw materials that are selected. In general, a sintering dwell time of about several hours is usually sufficient. However, the rare-earth oxysulfide sintered body following the sintering step must be densified to a relative density of not less than 92%.

(Hot Isostatic Pressing (HIP))

In the production method of the invention, after passing through the sintering step, a step in which hot isostatic pressing (HIP) is carried out may be additionally provided.

The type of pressurizing gas medium used at this time may be an inert gas such as argon or nitrogen, or may be $Ar-O_2$; $Ar-SO_2$ is preferred. The pressure applied by the pressurizing gas medium is preferably between 50 and 300 MPa, and more preferably between 100 and 300 MPa. At below 50 MPa, a transparency improving effect may not be obtained, whereas increasing the pressure to above 300 MPa does not yield a higher improvement in transparency and places an excessive load on the equipment, which may lead to equipment damage. It is convenient and thus desirable for the applied pressure to be 196 MPa or below, at which treatment can be carried out in a commercial HIP apparatus.

The treatment temperature at this time (specific holding temperature) should be suitably set according to the type of material and/or the sintered state. For example, this may be set in the range of 1,000 to 2,000° C., and preferably 1,100 to 1,600° C. As in the sintering step, it is critical for the treatment temperature here to be set no higher than the melting point and/or no higher than the phase transition temperature of the rare-earth oxysulfide making up the sintered body. At a heat treatment temperature above 2,000° C., the rare-earth oxysulfide sintered body that is expected in this invention ends up either exceeding the melting point or exceeding the phase transition point, making it difficult to carry out proper HIP treatment. On the other hand, at a heat treatment temperature below 1,000° C., a sintered body transparency improving effect is not obtained. The heat treatment temperature holding time, although not particularly limited, should be suitably adjusted while ascertaining the properties of the rare-earth oxysulfide making up the sintered body.

The heater material, heat-insulating material and treatment vessel used to carry out HIP treatment are not particularly limited, although preferred use can be made of graphite or molybdenum (Mo).

(Optical Polishing)

In the production method of the invention, it is preferable for the transparent rare-earth oxysulfide sintered body (transparent ceramic) obtained by the above series of production steps to be optically polished at both endfaces on the axis thereof that is to be optically used. The optical surface accuracy at this time is preferably $\lambda/8$ or below, and more preferably $\lambda/10$ or below ($\lambda$=633 nm). Optical loss may be further reduced by suitably forming an antireflective coating on the optically polished surface.

A magneto-optical material which has a Verdet constant at a wavelength of 1064 nm that is at least 0.14 min/(Oe·cm) can thereby be obtained. The magneto-optical material of the invention preferably has, for an optical path length of 10 mm, an in-line transmittance on the baseline of light transmission at a wavelength of 1064 nm that is 60% or more. In this invention, "in-line transmittance on the baseline" refers to, when absorption by a sintering aid or a rare-earth oxysulfide appears in a transmission spectrum of wavelength versus transmittance, the in-line transmittance in the transmittance spectrum extrapolated to zero absorption. The in-line transmittance is a value obtained by subtracting the scattering transmittance (diffuse transmittance) from total light transmittance in accordance with JIS K7361 and JIS K7136. When laser light having a wavelength of 1064 nm is input to the magneto-optical material of the invention over an optical path length of 10 mm and at a beam diameter of 1.6 mm, the maximum input power of laser light that does not generate a thermal lens is preferably 40 W or more, and more preferably 80 W or more. At a thermal lens-free maximum input power below 40 W, use of the inventive magneto-optical material in a high-power fiber laser system may be difficult.

[Magneto-Optical Device]

The magneto-optical material of the invention is suitable for magneto-optical device applications, and is particularly well-suited for use as a Faraday rotator in an optical isolator that operates at wavelengths of 0.9 to 1.1 μm.

FIG. 1 is a schematic cross-sectional diagram showing an example of an optical isolator which is an optical device that includes, as an optical element, a Faraday rotator made of the magneto-optical material of the invention. In FIG. 1, an optical isolator 100 is provided with a Faraday rotator 110 made of the magneto-optical material of the invention. A polarizer 120 and an analyzer 130, which are polarizing materials, are provided before and after the Faraday rotator 110. In the optical isolator 100, it is preferable for the polarizer 120, the Faraday rotator 110 and the analyzer 130 to be arranged in this order and for a magnet 140 to be mounted on at least one surface of the sidewalls thereof.

The optical isolator 110 can be suitably used in industrial fiber laser systems. That is, it is suitable for preventing laser light that has been emitted by a laser light source and is reflected from returning to the light source and destabilizing oscillation.

EXAMPLES

The invention is illustrated more fully below by way of Test Examples, Working Examples and Comparative Examples, although these Examples are not intended to limit the invention.

Test Example 1

Examples are described here in which yttrium, lutetium and gadolinium were selected as the rare-earth elements other than terbium.

The following powders were procured: terbium oxide powder, yttrium oxide powder, lutetium oxide powder and gadolinium oxide powder manufactured by Shin-Etsu Chemical Co., Ltd., and sulfur powder manufactured by Furuuchi Chemical Corporation. All had a purity of at least 99.9 wt %. In addition, zirconium oxide powder manufactured by Daiichi Kigenso Kagaku Kogyo Co., Ltd. was procured as a sintering aid. This too had a purity of at least 99.9 wt %.

Using these raw materials, three groups of differing systems were created, consisting respectively of systems obtained by forming solid solutions of terbium and yttrium, systems obtained by forming solid solutions of terbium and lutetium, and systems obtained by forming solid solutions of terbium and gadolinium. Solid solutions having the constituent ratios shown in Table 1 were prepared.

To the materials having differing constituent ratios in the three groups were also added: sulfur weighed out to a molar ratio of oxygen to sulfur of 2:1, and 0.5 wt % of zirconium oxide, based on the total weight. In addition, a system to which sulfur had not been added was created in each of the three groups.

The resulting powder materials were each separately filled into an alumina crucible, covered with an alumina lid and fired at 1300° C. for 4 hours, yielding oxysulfide materials and oxide materials for the respective systems.

Each of the resulting materials was dry ground and then uniaxially pressed, and also isostatically pressed at a pressure of 198 MPa, giving a CIP compact. Next, the resulting compact was loaded into a vacuum furnace and treated at 1300° C.±20° C. for 3 hours, giving a sintered compact. The sintering temperature at this time was finely adjusted so that the sintered relative density of each sample becomes 92%.

The resulting sintered bodies were each loaded into an HIP furnace having a molybdenum heater, and HIP treated for 3 hours in argon at 150 MPa and 1350° C.

Each of the ceramic sintered compacts thus obtained was ground and polished to a length of 10 mm, following which both optical endfaces of the sample were given a final optical polish at an optical surface accuracy of $\lambda/8$ and then coated with an antireflective coating designed so that the center wavelength becomes 1064 nm.

As shown in FIG. 1, polarizing elements were set before and after each of the resulting ceramic samples, and the sample was then covered with a magnet. Using a high-power laser (beam diameter, 1.6 mm) manufactured by IPG Photonics Japan, high-power laser light having a wavelength of 1064 nm was input from both endfaces, and the in-line transmittance, Verdet constant and maximum input power that does not generate a thermal lens were measured.

(Method of Measuring in-Line Transmittance)

The in-line transmittance was determined in accordance with JIS K7361 and JIS K7136 by using a spectrophotometer (available under the trade name V670 from JASCO Corporation) to measure the intensity of light transmitted through a sample when 1064 nm wavelength light is applied at a beam diameter of 1 to 3 mm, and inserting the measured value into the following formula.

In-line transmittance=$I/Io \times 100$

Here, I is the transmitted light intensity (intensity of in-line transmitted light through a sample having a length of 10 mm), and Io is the incident light intensity.

(Method of Measuring Verdet Constant)

The Verdet constant V was determined based on the following formula.

$\theta = V \times H \times L$

Here, $\theta$ is the Faraday rotation angle (minutes), V is the Verdet constant, H is the magnitude of the magnetic field (Oe), and L is the length of the Faraday rotator (in this case, 1 cm).

(Method of Measuring Maximum Input Power that does not Generate a Thermal Lens)

The maximum input power that does not generate a thermal lens was determined by outputting light at each input power as spatial light at a beam diameter of 1.6 mm, and then reading off the maximum input power when the change in focal distance becomes 0.1 or less after inserting therein the Faraday rotator.

The high-power laser used had a maximum power of 100 W. Hence, thermal lens evaluation above this power level was not possible.

These results are all presented in Table 1.

TABLE 1

| | Composition | Tb:R ratio | In-line transmittance (%/10 mm) | Verdet constant (min/(Oe · cm)) | Maximum thermal lens-free input power (W) |
|---|---|---|---|---|---|
| Example 1 | $(Tb_{0.3}Y_{0.7})_2O_2S$ | 0.3:0.7 | 98 | 0.14 | ≥100 |
| Example 2 | $(Tb_{0.4}Y_{0.6})_2O_2S$ | 0.4:0.6 | 97 | 0.19 | ≥100 |
| Example 3 | $(Tb_{0.5}Y_{0.5})_3O_3S$ | 0.5:0.5 | 97 | 0.24 | ≥100 |
| Example 4 | $(Tb_{0.6}Y_{0.4})_2O_2S$ | 0.6:0.4 | 96 | 0.27 | ≥100 |
| Example 5 | $(Tb_{0.7}Y_{0.3})_2O_2S$ | 0.7:0.3 | 90 | 0.32 | 80 |
| Example 6 | $(Tb_{0.8}Y_{0.3})_3O_2S$ | 0.8:0.2 | 72 | 0.35 | 50 |
| Example 7 | $(Tb_{0.3}Lu_{0.7})_2O_2S$ | 0.3:0.7 | 97 | 0.14 | ≥100 |
| Example 8 | $(Tb_{0.4}Lu_{0.6})_3O_3S$ | 0.4:0.6 | 97 | 0.19 | ≥100 |
| Example 9 | $(Tb_{0.5}Lu_{0.5})_2O_2S$ | 0.5:0.5 | 96 | 0.25 | ≥100 |
| Example 10 | $(Tb_{0.6}Lu_{0.4})_2O_2S$ | 0.6:0.4 | 95 | 0.28 | ≥100 |
| Example 11 | $(Tb_{0.7}Lu_{0.3})_2O_2S$ | 0.7:0.3 | 88 | 0.32 | 80 |

TABLE 1-continued

| | Composition | Tb:R ratio | In-line transmittance (%/10 mm) | Verdet constant (min/(Oe·cm)) | Maximum thermal lens-free input power (W) |
|---|---|---|---|---|---|
| Example 12 | $(Tb_{0.8}Lu_{0.2})_2O_2S$ | 0.8:0.2 | 65 | 0.35 | 50 |
| Example 13 | $(Tb_{0.3}Gd_{0.7})_2O_2S$ | 0.3:0.7 | 85 | 0.14 | ≥100 |
| Example 14 | $(Tb_{0.4}Gd_{0.6})_2O_2S$ | 0.4:0.6 | 88 | 0.18 | ≥100 |
| Example 15 | $(Tb_{0.5}Gd_{0.5})_2O_2S$ | 0.5:0.5 | 92 | 0.23 | ≥100 |
| Example 16 | $(Tb_{0.6}Gd_{0.4})_2O_2S$ | 0.6:0.4 | 95 | 0.26 | ≥100 |
| Example 17 | $(Tb_{0.7}Gd_{0.3})_3O_3S$ | 0.7:0.3 | 85 | 0.31 | 80 |
| Example 18 | $(Tb_{0.8}Gd_{0.2})_2O_2S$ | 0.8:0.2 | 60 | 0.33 | 40 |
| Comparative Example 1 | $(Tb_{0.1}Y_{0.9})_2O_2S$ | 0.1:0.9 | 98 | 0.06 | ≥100 |
| Comparative Example 2 | $(Tb_{0.2}Y_{0.8})_2O_2S$ | 0.2:0.8 | 97 | 0.09 | ≥100 |
| Comparative Example 3 | $(Tb_{0.5}Y_{0.5})_3O_3$ | 0.5:0.5 | 97 | 0.22 | 30 |
| Comparative Example 4 | $(Tb_{0.6}Y_{0.4})_2O_3$ | 0.6:0.4 | 95 | 0.24 | 20 |
| Comparative Example 5 | $(Tb_{0.7}Y_{0.3})_2O_3$ | 0.7:0.3 | 91 | 0.3 | 10 |
| Comparative Example 6 | $(Tb_{0.1}Lu_{0.9})_2O_2S$ | 0.1:0.9 | 97 | 0.05 | ≥100 |
| Comparative Example 7 | $(Tb_{0.2}Lu_{0.8})_2O_2S$ | 0.2:0.8 | 97 | 0.08 | ≥100 |
| Comparative Example 8 | $(Tb_{0.5}Lu_{0.5})_3O_3$ | 0.5:0.5 | 96 | 0.23 | 30 |
| Comparative Example 9 | $(Tb_{0.6}Lu_{0.4})_2O_3$ | 0.6:0.4 | 94 | 0.25 | 20 |
| Comparative Example 10 | $(Tb_{0.7}Lu_{0.3})_2O_3$ | 0.7:0.3 | 91 | 0.29 | 10 |
| Comparative Example 11 | $(Tb_{0.1}Gd_{0.9})_3O_3S$ | 0.1:0.9 | 80 | 0.05 | 80 |
| Comparative Example 12 | $(Tb_{0.2}Gd_{0.8})_2O_2S$ | 0.2:0.8 | 81 | 0.09 | 80 |
| Comparative Example 13 | $(Tb_{0.5}Gd_{0.5})_2O_3$ | 0.5:0.5 | 90 | 0.23 | 20 |
| Comparative Example 14 | $(Tb_{0.6}Gd_{0.4})_3O_3$ | 0.6:0.4 | 91 | 0.25 | 15 |
| Comparative Example 15 | $(Tb_{0.7}Gd_{0.3})_2O_3$ | 0.7:0.3 | 80 | 0.29 | 10 |

From the above results, it was confirmed that by setting the terbium ratio in the solid solution to 0.3 or more, the Verdet constant becomes 0.14 min/(Oe·cm) and that, in the case of oxysulfides, the maximum thermal lens-free input power is 40 W or more. It was also confirmed that by limiting the terbium ratio in the solid solution to at least 0.3 and not more than 0.7, the maximum thermal lens-free input power is improved to 80 W or more.

Conversely, it was also found from these results that, at a terbium ratio in the solid solution of 0.2 or less, the Verdet constant was small at less than 0.1 min/(Oe·cm). In addition, it also became clear that, when the compound is an oxide rather than an oxysulfide, the maximum thermal lens-free input power ends up being no more than 20 W.

Test Example 2

Examples are described here in which holmium, scandium, ytterbium, europium and dysprosium were selected as the rare-earth elements other than terbium.

The following powders were procured: terbium oxide powder, holmium oxide powder, scandium oxide powder, ytterbium oxide powder, europium oxide powder and dysprosium oxide powder manufactured by Shin-Etsu Chemical Co., Ltd., and sulfur powder manufactured by Furuuchi Chemical Corporation. All had a purity of at least 99.9 wt %. In addition, zirconium oxide powder manufactured by Daiichi Kigenso Kagaku Kogyo Co., Ltd. was procured as a sintering aid. This too had a purity of at least 99.9 wt %.

Using these respective rare-earth materials, samples were fabricated in which the ratio of terbium to the other rare-earths in solid solution was varied. Solid solutions having the constituent ratios shown in Table 2 were prepared.

To these various materials having differing constituent ratios were also added: sulfur weighed out to a molar ratio of oxygen to sulfur of 2:1, and 0.5 wt % of zirconium oxide, based on the total weight. Also, a system to which sulfur had not been added was created in each of the groups.

The resulting powder materials were each separately filled into an alumina crucible, covered with an alumina lid and fired at 1300° C. for 4 hours, yielding oxysulfide materials and oxide materials for the respective systems.

Each of the resulting materials was dry ground, and then uniaxially pressed, and also isostatically pressed at a pressure of 198 MPa, giving a CIP compact. Next, the resulting compact was loaded into a vacuum furnace and treated at 1300° C.±20° C. for 3 hours, giving a sintered compact. The sintering temperature at this time was finely adjusted so that the sintered relative density of each sample becomes 92%.

The resulting sintered bodies were each loaded into an HIP furnace having a molybdenum heater, and HIP treated for 3 hours in argon at 150 MPa and 1350° C.

Each of the ceramic sintered compacts thus obtained was ground and polished to a length of 10 mm, following which both optical endfaces of the sample were given a final optical polish at an optical surface accuracy of λ/8 (λ=633 nm) and then coated with an antireflective coating designed so that the center wavelength becomes 1064 nm.

As shown in FIG. 1, polarizing elements were set before and after each of the resulting ceramic samples, and the sample was then covered with a magnet. Using a high-power laser (beam diameter, 1.6 mm) manufactured by IPG Photonics Japan, high-power laser light having a wavelength of 1064 nm was input from both endfaces, and the in-line transmittance, Verdet constant and maximum input power which does not generate a thermal lens were measured.

The high-power laser used had a maximum power of 100 W. Hence, thermal lens evaluation above this power level was not possible.

These results are all presented in Table 2.

TABLE 2

| | Composition | Tb:R ratio | In-line transmittance (%/10 mm) | Verdet constant (min/(Oe · cm)) | Maximum thermal lens-free input power (W) |
|---|---|---|---|---|---|
| Example 19 | $(Tb_{0.6}Ho_{0.4})_2O_2S$ | 0.6:0.4 | 97 | 0.28 | ≥100 |
| Example 20 | $(Tb_{0.6}Sc_{0.4})_2O_2S$ | 0.6:0.4 | 97 | 0.28 | ≥100 |
| Example 21 | $(Tb_{0.6}Yb_{0.4})_2O_2S$ | 0.6:0.4 | 88 | 0.27 | 80 |
| Example 22 | $(Tb_{0.6}Eu_{0.4})_2O_2S$ | 0.6:0.4 | 90 | 0.27 | 90 |
| Example 23 | $(Tb_{0.6}Dy_{0.4})_2O_2S$ | 0.6:0.4 | 82 | 0.27 | 80 |
| Comparative Example 16 | $(Tb_{0.2}Ho_{0.8})_2O_2S$ | 0.2:0.8 | 98 | 0.05 | ≥100 |
| Comparative Example 17 | $(Tb_{0.2}Sc_{0.8})_2O_2S$ | 0.2:0.8 | 98 | 0.06 | ≥100 |
| Comparative Example 18 | $(Tb_{0.2}Yb_{0.8})_2O_2S$ | 0.2:0.8 | 86 | 0.06 | 70 |
| Comparative Example 19 | $(Tb_{0.2}Eu_{0.8})_2O_2S$ | 0.2:0.8 | 90 | 0.05 | ≥100 |
| Comparative Example 20 | $(Tb_{0.2}Dy_{0.8})_2O_2S$ | 0.2:0.8 | 80 | 0.05 | 70 |
| Comparative Example 21 | $(Tb_{0.6}Ho_{0.4})_2O_3$ | 0.6:0.4 | 97 | 0.27 | 20 |
| Comparative Example 22 | $(Tb_{0.6}Sc_{0.4})_2O_3$ | 0.6:0.4 | 97 | 0.28 | 15 |
| Comparative Example 23 | $(Tb_{0.6}Yb_{0.4})_2O_3$ | 0.6:0.4 | 88 | 0.28 | 10 |
| Comparative Example 24 | $(Tb_{0.6}Eu_{0.4})_2O_3$ | 0.6:0.4 | 90 | 0.27 | 15 |
| Comparative Example 25 | $(Tb_{0.6}Dy_{0.4})_2O_3$ | 0.6:0.4 | 82 | 0.27 | 10 |

The above results confirmed characteristics which, even in cases where the rare-earth element formed into a solid solution with terbium was holmium, scandium, ytterbium, europium or dysprosium, were similar to those obtained according to the results in Test Example 1, Although some embodiments of the present invention have been disclosed here for illustrative purposes, those skilled in the art will appreciate that various modifications such as other embodiments, additions and substitutions are possible, insofar as the operation and advantageous effects of the invention are exhibited in all such variations, without departing from the scope and spirit of the invention as disclosed in the accompanying claims.

REFERENCE SIGNS LIST

100 Optical isolator
110 Faraday rotator
120 Polarizer
130 Analyzer
140 Magnet

The invention claimed is:

1. A magneto-optical material which is characterized by comprising either a transparent ceramic containing as a primary component a rare-earth oxysulfide of formula (1) below or a single-crystal of a rare-earth oxysulfide of formula (1)

$$(Tb_xR_{1-x})_2O_2S \qquad (1)$$

wherein x is 0.3 or more but less than 1, and R is at least one rare-earth element selected from the group consisting of yttrium, lutetium, gadolinium, holmium, scandium, ytterbium, europium and dysprosium, and having a Verdet constant at a wavelength of 1064 nm that is at least 0.14 min/(Oe·cm).

2. The magneto-optical material of claim 1 which is characterized in that when laser light having a wavelength of 1064 nm is input thereto at a beam diameter of 1.6 mm, for an optical path length of 10 mm, the maximum input power of laser light which does not generate a thermal lens is 40 W or more.

3. The magneto-optical material of claim 1 which, for an optical path length of 10 mm, has an in-line transmittance of light at a wavelength of 1064 nm that is at least 60%.

4. A magneto-optical device which is constructed using the magneto-optical material of claim 1.

5. The magneto-optical device of claim 4 which is an optical isolator that comprises the magneto-optical material as a Faraday rotator and a polarizing material at front and back sides of the Faraday rotator on an optical axis thereof, and that can be used in a wavelength range of at least 0.9 □m and not more than 1.1 □m.

6. The magneto-optical device of claim 5, wherein the Faraday rotator has an antireflective coating on an optical face thereof.

7. The magneto-optical material of claim 1 wherein the transparent ceramic is a transparent rare-earth oxysufide sintered material of formula (1).

8. The magneto-optical material of claim 1, which has higher maximum thermal lens-free input power in a wavelength of 1064 nm than the $(Tb_xR_{1-x})_2O_3$ oxide, wherein R and x are the same as R and x in formula (1) of the oxysulfide.

9. A method for producing a magneto-optical material, comprising the steps of firing in a crucible terbium oxide powder, a rare-earth oxide powder of at least one rare-earth element selected from the group consisting of yttrium, lutetium, gadolinium, holmium, scandium, ytterbium, europium and dysprosium, and sulfur powder; grinding the fired powders to form a rare-earth oxysulfide material powder; pressing the rare-earth oxysulfide material powder into a predetermined shape; and then sintering and hot isostatic pressing the shaped powder to form a transparent ceramic sintered compact containing as a primary component a rare-earth oxysulfide of formula (1) below $$(Tb_xR_{1-x})_2O_2S \tag{1}$$

wherein x is 0.3 or more but less than 1, and R is at least one rare-earth element selected from the group consisting of yttrium, lutetium, gadolinium, holmium, scandium, ytterbium, europium and dysprosium.

* * * * *